US012713874B2

(12) United States Patent
Osawa et al.

(10) Patent No.: US 12,713,874 B2
(45) Date of Patent: Aug. 18, 2026

(54) EFEM AND METHOD OF CONTROLLING SUPPLY AMOUNT OF INERT GAS

(71) Applicant: Sinfonia Technology Co., Ltd., Tokyo (JP)

(72) Inventors: Masahiro Osawa, Tokyo (JP); Toshihiro Kawai, Tokyo (JP)

(73) Assignee: Sinfonia Technology Co., Ltd., Tokyo (JP)

( * ) Notice: Subject to any disclaimer, the term of this patent is extended or adjusted under 35 U.S.C. 154(b) by 183 days.

(21) Appl. No.: 18/816,049

(22) Filed: Aug. 27, 2024

(65) Prior Publication Data

US 2024/0420980 A1 Dec. 19, 2024

Related U.S. Application Data

(63) Continuation of application No. 17/894,328, filed on Aug. 24, 2022, now Pat. No. 12,087,606.

(30) Foreign Application Priority Data

Aug. 26, 2021 (JP) ................................ 2021-137819

(51) Int. Cl.
*H10P 72/10* (2026.01)

(52) U.S. Cl.
CPC ...... *H10P 72/1928* (2026.01); *H10P 72/1924* (2026.01)

(58) Field of Classification Search
CPC ............. H01L 21/673; H01L 21/67396; H01L 21/67389; H01L 21/67766;
(Continued)

(56) References Cited

U.S. PATENT DOCUMENTS

2015/0045961 A1* 2/2015 Koshti ................ H10P 72/0468 700/276
2015/0170945 A1 6/2015 Segawa et al.
(Continued)

FOREIGN PATENT DOCUMENTS

JP 20151 46349 A 8/2015

OTHER PUBLICATIONS

U.S. Appl. No. 17/894,328, Notice of Allowance, dated May 16, 2024.

*Primary Examiner* — Danny Nguyen
(74) *Attorney, Agent, or Firm* — Kilpatrick Townsend & Stockton LLP

(57) ABSTRACT

An EFEM includes a housing having a substantially closed substrate transfer space in the housing and a control part configured to perform a control of supplying an inert gas into at least the housing. The control part includes an inert gas total supply amount setting part configured to set a total supply amount of the inert gas to be supplied into the housing; a door open/purge determination part configured to determine whether a container door of a substrate storage container is in an open state and whether a purge device is performing a purge process; and an in-housing inert gas supply amount calculation part configured to calculate a supply amount of the inert gas to be supplied into the housing. The supply amount of the inert gas to be supplied into the housing is determined according to an inert gas supply amount command value determined based on a calculation result.

11 Claims, 7 Drawing Sheets

(58) Field of Classification Search
CPC ............. H01L 21/67772; H01L 21/677; H01L 21/687; H05F 3/06; H10P 72/1928; H10P 72/1924; H10P 72/3408
USPC ......................................... 361/213, 220, 230
See application file for complete search history.

(56) References Cited

U.S. PATENT DOCUMENTS

| | | | | |
|---|---|---|---|---|
| 2016/0147235 | A1* | 5/2016 | Rice ....................... | G05B 15/02 700/282 |
| 2022/0285192 | A1 | 9/2022 | Hsu et al. | |

* cited by examiner

Oxygen concentration meter
2e
Pressure meter
2f
Hygrometer
2g
Control part
1C
Control part
MC
M
Control part
3C
X
1
2
21
2a
22
3
32
31
33
34
35
351
36
37
4
4S
41
42
43
44
W
22a
22b
22c
22d
23
2b
2Sa
2Sb
51
53
531
54
55
61
7
71
72
73
74
75
8
MS
R
R1
R1a
R2
R3
R3a
R4
R4a
R5
R5a
R6
R7
R8
R9
R11
R12
R13
i
ii
iii
iv
v

FIG. 4

Oxygen concentration control table

| | | Control target | Fixed | Fixed | Fixed | Fixed | Variable | Variable | Variable |
|---|---|---|---|---|---|---|---|---|---|
| N | T | A | B | C | D | E | F | G | H |
| Oxygen concentration in EFEM (ppm) | Total $N_2$ supply amount (LPM) | EFEM MFC Purge (LPM) | Main Purge (LPM) | Robot Ejector (LPM) | Robot Inner Purge (LPM) | Ionizer Purge (LPM) | LP-1 MFC Purge (LPM) | LP-2 MFC Purge (LPM) | LP-3 MFC Purge (LPM) |
| 130 or more | 360 | 200 | 100 | 10 | 0 | 50 | 0 | 0 | 0 |
| 90-129 | 310 | 150 | 100 | 10 | 0 | 50 | 0 | 0 | 0 |
| 70-89 | 260 | 100 | 100 | 10 | 0 | 50 | 0 | 0 | 0 |
| 50-69 | 210 | 50 | 100 | 10 | 0 | 50 | 0 | 0 | 0 |
| 49 or less | 165 | ~~0~~ 5 | 100 | 10 | 0 | 50 | 0 | 0 | 0 |

FIG. 7

Oxygen concentration control table (when LP-1 is opened and bottom purge is being performed at 50 LPM)

| | | Control target | Fixed | Fixed | Fixed | Fixed | Variable | Variable | Variable |
|---|---|---|---|---|---|---|---|---|---|
| N | T | A | B | C | D | E | F | G | H |
| Oxygen concentration in EFEM (ppm) | Total $N_2$ supply amount (LPM) | EFEM MFC Purge (LPM) | Main Purge (LPM) | Robot Ejector (LPM) | Robot Inner Purge (LPM) | Ionizer Purge (LPM) | LP-1 MFC Purge (LPM) | LP-2 MFC Purge (LPM) | LP-3 MFC Purge (LPM) |
| 130 or more | 360 | 150 | 100 | 10 | 0 | 50 | 50 | 0 | 0 |
| 90-129 | 310 | 100 | 100 | 10 | 0 | 50 | 50 | 0 | 0 |
| 70-89 | 260 | 50 | 100 | 10 | 0 | 50 | 50 | 0 | 0 |
| 50-69 | 215 | θ 6 | 100 | 10 | 0 | 50 | 50 | 0 | 0 |
| 49 or less | 215 | θ 5 | 100 | 10 | 0 | 50 | 50 | 0 | 0 |

EFEM AND METHOD OF CONTROLLING SUPPLY AMOUNT OF INERT GAS

CROSS-REFERENCE TO RELATED APPLICATIONS

This application is a continuation of U.S. patent application Ser. No. 17/894,328, filed on Aug. 24, 2022, which application is based upon and claims the benefit of priority from Japanese Patent Application No. 2021-137819, filed on Aug. 26, 2021, the entire contents each of which are incorporated herein by reference.

TECHNICAL FIELD

The present disclosure relates to an EFEM (Equipment Front End Module) used for automatic transfer of a substrate and, particularly, to a control system and a control method for supplying an inert gas such as a nitrogen gas or the like into a housing which is a main body of the EFEM.

BACKGROUND

In a semiconductor manufacturing process, a substrate is processed in a clean room in order to improve yield and quality. In recent years, a "mini-environment method," which further improves the cleanliness only in a local space around the substrate, has been introduced, and a means for performing a substrate transfer and other processing has been employed. In the mini-environment method, a load port, which constitutes a part of a wall surface of a housing having a substantially closed substrate transfer space (hereinafter referred to as "transfer space") and has a function of mounting a FOUP (Front-Opening Unified Pod) that is a container configured to store substrates in a highly clean internal space, and opening and closing a door of the FOUP while making close contact with a door of the FOUP (hereinafter referred to as "FOUP door"), is installed adjacent to the housing.

The load port is a device for entrance of a substrate into and from the inside of the housing, and functions as an interface part between the housing and the FOUP. And, when a door of the load port (hereinafter referred to as "load port door") capable of engaging with the FOUP door to open and close the FOUP door is opened, it is configured to be capable of taking out the substrate from the FOUP into the inside of the housing, or storing the substrate from the housing into the FOUP by a substrate transfer robot arranged in the transfer space in the housing.

Further, in the semiconductor manufacturing process, a storage pod called the above-mentioned FOUP is used in order to appropriately maintain an atmosphere around the substrates. The substrates are accommodated and managed inside the FOUP. Particularly, in recent years, higher integration of elements and miniaturization of circuits have been sought. Therefore, it is required to maintain a high degree of cleanliness around the substrate so that particles and moisture do not adhere to a surface of the substrate. Thus, there has been performed a process of filling the inside of the FOUP with a nitrogen gas (purge process) to create a nitrogen gas atmosphere, which is an inert gas atmosphere, around the substrates, or keeping the inside of the FOUP in a vacuum state so that a surface property of the substrate does not change due to oxidation of the substrate surface or the like.

Further, the EFEM configured to fill the inside of the housing with a nitrogen gas, which is an inert gas, has been devised and put into practical use (e.g., Patent Document 1). Specifically, this EFEM includes a circulation flow path including a transfer space for circulating a nitrogen gas inside a transfer chamber, a gas supply means for supplying the nitrogen gas to the circulation flow path, and a gas discharge means for discharging the nitrogen gas from the circulation flow path. The nitrogen gas is appropriately supplied and discharged according to fluctuations in oxygen concentration and the like in the circulation flow path. Thus, as compared with a configuration in which a nitrogen gas is constantly supplied and discharged, it is possible to maintain the transfer chamber in a nitrogen gas atmosphere while suppressing an increase in the supply amount of the nitrogen gas.

In a process of manufacturing a next-generation semiconductor device, which is becoming finer and more multi-layered on the order of nanometers, in order to improve yield and quality stability of the semiconductor device, it is needed to isolate the substrate transfer space from an outside atmosphere of the substrate transfer space, thereby obtaining effects of preventing oxidation and corrosion in a highly-pure nitrogen gas atmosphere (extremely low oxygen concentration/humidity). In order to meet such needs, it has become necessary to manage, at an even higher level, environmental items in the transfer chamber, which have not been regarded as being important in the past. Specific required levels are low humidity (e.g., dew point humidity less than-50 degrees), low oxygen concentration (e.g., 100 ppm), and the like. Further, deterioration of the substrate during the semiconductor manufacturing process also becomes problematic along with the miniaturization and multi-layering of semiconductors. Hazardous substances that deteriorate the substrate are released from the substrate as time passes after the processing thereof. For this reason, in recent years, measures have been taken to prevent and suppress deterioration of the substrate during standby by adopting a configuration in which the nitrogen gas is continuously supplied from a bottom purge nozzle even to the substrates waiting in the FOUP after opening the FOUP door, in addition to a bottom purge process of placing the FOUP on the load port and purging the inside of the FOUP with a nitrogen gas before opening the FOUP door.

PRIOR ART DOCUMENTS

Patent Documents

Patent Document 1: Japanese Patent Application Publication No. 2015-146349

However, in the conventional EFEM, an amount of the nitrogen gas supplied to the transfer chamber and an amount of the nitrogen gas supplied to the load port during the bottom purge process are controlled separately. Therefore, if the bottom purge is continued by opening the FOUP door in a state in which the FOUP is docked to the housing, a problem arises in that the nitrogen gas may flow into the housing more than the specified amount, and the pressure inside the housing may increase.

In addition, when the pressure becomes higher than a default value, it is possible to exhaust the nitrogen gas in the housing from the exhaust port. However, if the exhaust is performed only for pressure reduction even though there is no abnormality in the oxygen concentration and humidity, the nitrogen gas may be wasted.

SUMMARY

The present disclosure has been made in view of such a problem, and the main purpose thereof is to provide an EFEM capable of avoiding waste of a nitrogen gas and keeping the pressure in a housing at a slightly positive pressure by using a specified amount of nitrogen gas, and a method of controlling the supply of an inert gas into an EFEM. The present disclosure is a technique capable of coping with a substrate storage container other than an FOUP.

That is, the present disclosure is directed to an EFEM that includes a housing having a substantially closed substrate transfer space in the housing, and a control part configured to perform a control of supplying an inert gas into at least the housing. In the EFEM according to the present disclosure, the control part includes: an inert gas total supply amount setting part configured to set a total supply amount of the inert gas to be supplied into the housing based on an oxygen concentration in the housing: a door open/purge determination part configured to determine, for each load port adjacent to the housing, whether a container door of a substrate storage container mounted on a mounting table, which is capable of mounting the substrate storage container, is in an open state and whether a purge device capable of replacing a gas atmosphere in the substrate storage container mounted on the mounting table with the inert gas is performing a purge process; and an in-housing inert gas supply amount calculation part configured to, when a determination result of the door open/purge determination part is "Yes," calculate a supply amount of the inert gas to be supplied into the housing, based on a value obtained by subtracting an in-container inert gas supply amount, which is a supply amount of the inert gas into the substrate storage container by the purge device of the load port, from the inert gas total supply amount set by the inert gas total supply amount setting part. The control part is configured to control the supply amount of the inert gas to be supplied into the housing according to an inert gas supply amount command value determined based on a calculation result of the in-housing inert gas supply amount calculation part.

The present inventor has adopted a novel and useful technical idea of controlling the supply amount of the inert gas (primarily, nitrogen gas) into the housing based on the purge execution status of the load port, and has consequently realized an EFEM that can avoid the wasteful use of a nitrogen gas and can keep the pressure in the transfer chamber of the EFEM at a slightly positive pressure with a specified amount of use of the inert gas.

That is, in the EFEM of the present disclosure, the supply amount of the inert gas into the housing is set based on the oxygen concentration in the housing. When the purge process is being performed by the purge device with the container door opened (when the determination result of the door open/bottom purge determination part is "Yes"), the inert gas supply amount (in-container inert gas supply amount) used for the purge process is subtracted from the total inert gas supply amount, the inert gas supply amount command value, which is the command value of the supply amount of the inert gas into the housing, is calculated based on the subtracted value, and the supply amount of the inert gas into the housing is controlled based on the inert gas supply amount command value. As a result, in consideration of the inert gas supply amount used during the execution of the purge process, the inert gas supply amount can be controlled so as not to exceed the upper limit of the entire gas supply amount of the EFEM (the total inert gas supply amount set based on the oxygen concentration in the housing). By avoiding the wasteful use of the inert gas in which the inert gas is discharged from the housing even when the oxygen concentration remains unchanged, it is possible to always keep the pressure in the housing of the EFEM at a slightly positive pressure with a specified amount of use of the inert gas while saving the inert gas.

In particular, in the EFEM according to the present disclosure, when changing the supply amount of the inert gas into the housing to the inert gas supply amount command value determined based on the calculation result of the in-housing inert gas supply amount calculation part (when updating the inert gas supply amount command value determined based on the calculation result of the in-housing inert gas supply amount calculation part as the latest inert gas supply amount command value) during the execution of the control of inert gas supply into the housing, the supply amount of the inert gas into the housing is gradually changed over a predetermined period of time. This makes it possible to prevent or suppress a sudden pressure change in the housing.

In case that the EFEM according to the present disclosure is configured to include an in-transfer robot inert gas supply device that supplies an inert gas into the substrate transfer robot arranged in the substrate transfer space, or configured to include an ionizer which locally supplies an inert gas to the substrate placed at a predetermined location in the substrate transfer space to eliminate static electricity from the substrate, the inert gas supply amount command value is desirably calculated and determined in consideration of these inert gas supply amounts. Specifically, when the in-transfer robot inert gas supply device is supplying the inert gas, the in-housing inert gas supply amount calculation part is desirably configured to calculate the supply amount of the inert gas to be supplied into the housing, based on a value obtained by subtracting the supply amount of the inert gas by at least the in-transfer robot inert gas supply device and the in-container inert gas supply amount from the inert gas total supply amount set by the inert gas total supply amount setting part. When the ionizer is supplying the inert gas, the in-housing inert gas supply amount calculation part is preferably configured to calculate the amount of the inert gas to be supplied into the housing, based on a value obtained by subtracting the amount of the inert gas supplied by at least the ionizer and the in-container inert gas supply amount from the inert gas total supply amount set by the inert gas total supply amount setting part.

In addition, the inert gas supply amount control method according to the present disclosure is an inert gas supply amount control method which is applicable to an EFEM including a housing having a substantially closed substrate transfer space in the housing and a control part configured to perform a control of supplying the inert gas into the housing. The method includes: setting a total supply amount of the inert gas to be supplied into the housing based on an oxygen concentration in the housing: determining, for each load port adjacent to the housing, whether a container door of a substrate storage container mounted on a mounting table capable of mounting the substrate storage container of the load port is in an open state and whether a purge device, which is capable of replacing a gas atmosphere in the substrate storage container mounted on the mounting table with the inert gas, is performing a purge process; calculating, when the determination result in the determining is "Yes," an amount of the inert gas to be supplied into the housing, based on a value obtained by subtracting a supply amount of an inert gas into a container, which is a supply amount of the inert gas into the substrate storage container by the purge device of the load port, from the total supply amount of the inert gas, which is set in the setting, and controlling a supply amount of the inert gas into the housing based on the calculation result in the calculating.

With such a method of controlling the supply amount of the inert gas according to the present disclosure, it is possible to obtain the same effects as those of the above-described EFEM according to the present disclosure, and it is possible to avoid a situation in which the inert gas is supplied into the housing in an amount more than the initial control amount. As a result, it is possible to prevent the pressure rise in the housing and to solve the problem caused by supplying an excess inert gas, that is, the problem that the inert gas is wastefully used by discharging the inert gas even when the oxygen concentration remains unchanged. This makes it possible to save the inert gas.

BRIEF DESCRIPTION OF DRAWINGS

The accompanying drawings, which are incorporated in and constitute a part of the specification, illustrate embodiments of the present disclosure.

FIG. 4 is a diagram showing an example of an oxygen concentration control table according to the embodiment.

FIG. 7 is a diagram showing an example of an oxygen concentration control table according to the embodiment.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Hereinafter, an embodiment of the present disclosure will be described with reference to the drawings.

Figure 1:
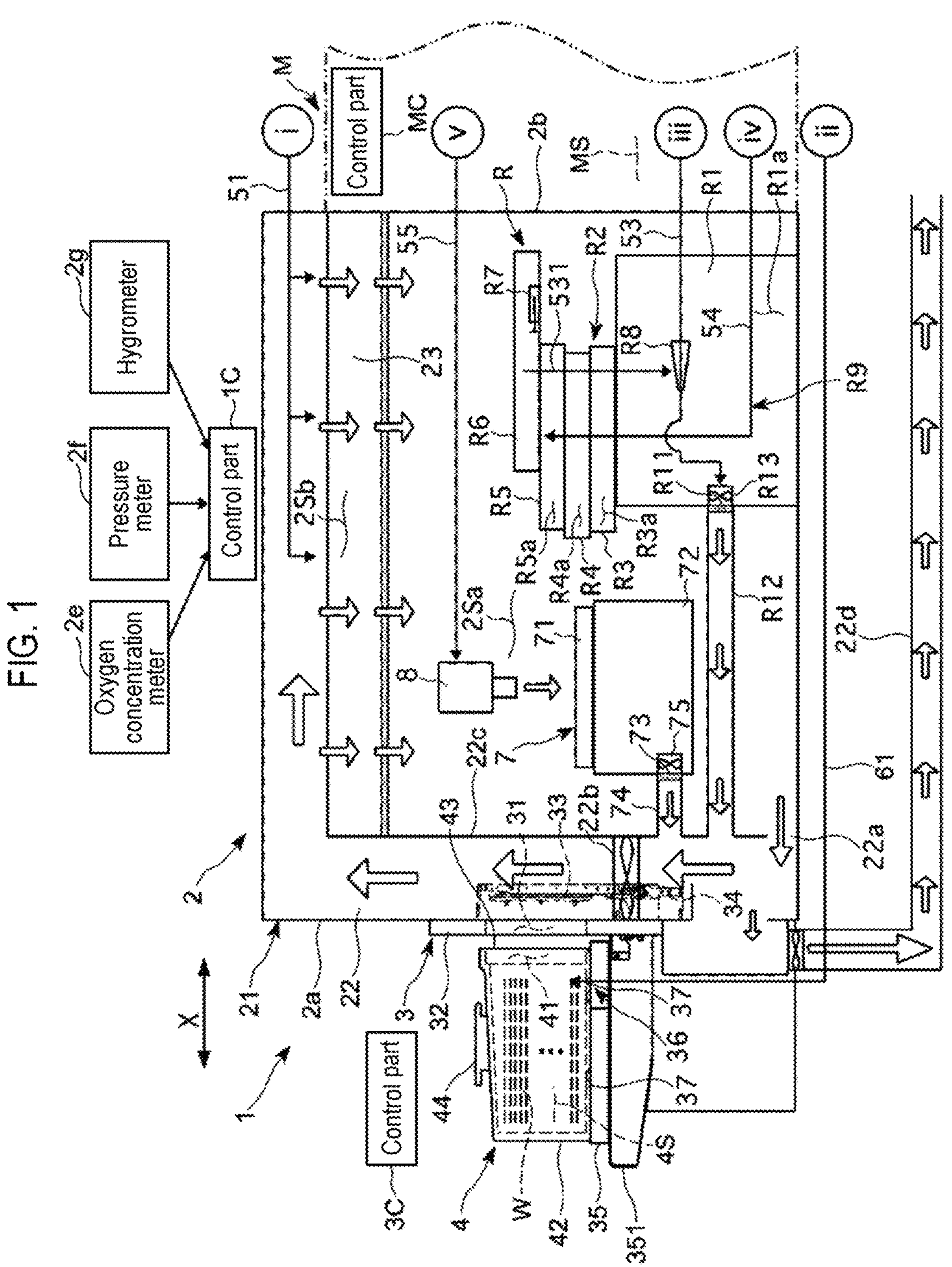
FIG. 1 is a side view schematically showing a relative positional relationship between an EFEM according to an embodiment of the present disclosure and peripheral devices thereof.

As shown in FIG. 1, an EFEM 1 (Equipment Front End Module) according to the present embodiment is used in a semiconductor manufacturing process, and includes a housing 2, which is a main body part arranged in a clean room, and a load port 3. FIG. 1 schematically shows a relative positional relationship between the EFEM 1 and peripheral devices of the EFEM 1. A FOUP 4 shown in FIG. 1 is a kind of "substrate storage container" according to the present disclosure, and is used together with the EFEM 1.

A processing apparatus M (semiconductor processing apparatus) is installed adjacent to a back wall 2*b* of the housing 2, which faces a front wall 2*a* on which the load port 3 is arranged. That is, the load port 3 is connected to an opening provided in the front wall 2*a* of the housing 2, and the processing apparatus M is connected to an opening provided in the back wall 2*b*, so that a substantially closed space (including a substrate transfer space 2Sa and an FFU installation space 2Sb) is formed inside the housing 2.

In the clean room, an internal space MS of the processing apparatus M, the substrate transfer space 2Sa and the FFU installation space 2Sb, which are an internal space of the housing 2, and an internal space 4S of the FOUP 4 mounted on the load port 3 are maintained at a high degree of cleanliness.

In the present embodiment, as shown in FIG. 1, the load port 3, the housing 2, and the processing device M are arranged in close contact with each other in the named order along the front-rear direction X of the EFEM 1. An operation of the EFEM 1 is controlled by an entire controller of the EFEM 1 (control part 1C shown in FIG. 1) and a controller of the load port 3 (control part 3C shown in FIG. 1). An operation of the processing apparatus M is controlled by a controller of the processing apparatus M (control part MC shown in FIG. 1). In this regard, the control part MC, which is the entire controller of the processing apparatus M, and the control part 1C, which is the entire controller of the EFEM 1, are host controllers of the control part 3C of the load port 3. Each of these control parts 1C, 3C and MC is composed of a typical microprocessor including a CPU, a memory, and an interface. The memory stores programs necessary for processing in advance. The CPU sequentially extracts and executes necessary programs, and cooperates with peripheral hardware resources to realize a desired function 5.

In the substrate transfer space 2Sa, which is the internal space of the housing 2, a substrate transfer robot R configured to be capable of transferring a substrate W (semiconductor wafer) between the FOUP 4 and the processing apparatus M is installed (see FIG. 1). An FFU 23 (fan filter unit) is installed in the FFU installation space 2Sb, which is a space above the substrate transfer space 2Sa in the internal space of the housing 2. By driving the FFU 23, it is possible to generate a downdraft in the substrate transfer space 2Sa of the housing 2, and circulate an inert gas (environmental gas) such as a nitrogen gas, which is a highly clean gas, in the substrate transfer space 2Sa. A circulation path 21 for circulating the nitrogen gas is formed inside the housing 2. The circulation path 21 is composed of a substrate transfer space 2Sa, an FFU installation space 2Sb, and a return path 22. In the circulation path 21, a clean nitrogen gas is sent downward from the FFU installation space 2Sb through the FFU 23. The clean nitrogen gas reaches a lower end of the substrate transfer space 2Sa, then rises through the return path 22 and returns to the FFU installation space 2Sb.

The FFU 23 is configured to remove particles contained in the nitrogen gas by a filter, while allowing a fan to send out the nitrogen gas in the FFU installation space 2Sb downward. The purified nitrogen gas is sent from the FFU installation space 2Sb to the substrate transfer space 2Sa to flow downward as a laminar flow. The nitrogen gas that has reached the lower end of the substrate transfer space 2Sa flows into the return path 22 through an opening 22*a* formed at a lower end of the return path 22. In the present embodiment, a fan 22*b* installed above the opening 22*a* sucks the nitrogen gas into the return path 22, sends the nitrogen gas upward, and returns the nitrogen gas to the FFU installation space 2Sb. The nitrogen gas returned to the FFU installation space 2Sb is cleaned by the FFU 23 and sent out to the substrate transfer space 2Sa again. The return path 22 is a path isolated from the substrate transfer space 2Sa and the FFU installation space 2Sb by a partition wall 22*c* (appropriate strut wall or the like). Only the opening 22*a* formed at the lower end of the return path 22 communicates with the substrate transfer space 2Sa, and only an upper end of the return path 22 communicates with the FFU installation space 2Sb.

Figure 2:
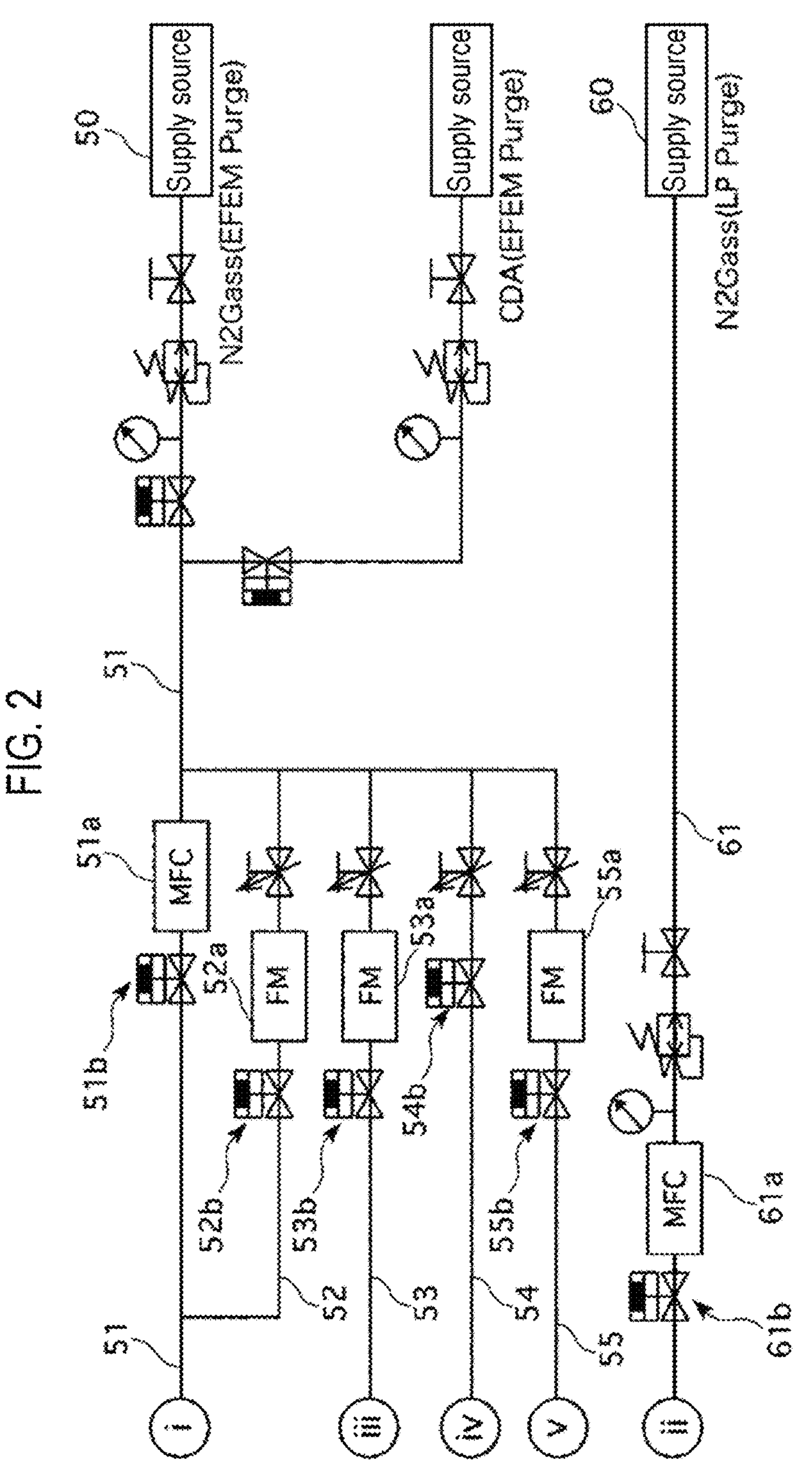
FIG. 2 is a diagram schematically showing a gas pipe system according to the embodiment.

With the above configuration, it is possible to circulate the nitrogen gas in the circulation path 21. A supply path 51 for supplying the nitrogen gas into the circulation path 21 is connected to a side portion of the FFU installation space 2Sb. As shown in FIG. 2, the supply path 51 is connected to the nitrogen gas supply source 50. At predetermined locations of the supply path 51, there are installed an MFC 51*a* (mass flow controller) that measures and controls a flow rate in the supply path 51, which is a gas flow path, and a supply valve 51*b* that can change a gas supply amount per unit time. In the present embodiment, a sub supply path 52 that branches from a predetermined location on an upstream side of the MFC 51*a* and the supply valve 51*b* in the supply path 51 is installed and connected to a predetermined location on a downstream side of the MFC 51*a* and the supply valve 51*b* in the supply path 51. A supply valve 52*b* for switching an on/off of supply of the nitrogen gas is installed at a predetermined location in the sub supply path 52. An "FM" shown in FIG. 2 is a flow meter 52*a*. Therefore, in the present embodiment, a part of an amount of a gas supplied into the circulation path 21 can be borne by an amount of the gas supplied through the sub supply path 52. In the present embodiment, a supply source for the supply path 51 is configured to be switchable between the above-mentioned nitrogen gas supply source 50 and the CDA (clean dry air) supply source shown in FIG. 2. The lowercase Roman numerals shown in FIG. 1 are used in the sense of being continuous with the same lowercase Roman numerals shown in FIG. 2.

Further, as shown in FIG. 1, a discharge pipe 22*d* for discharging the gas in the circulation path 21 is connected to a front end portion of the substrate transfer space 2Sa. The discharge pipe 22*d* communicates with the external space. A discharge valve which is controlled according to the pressure in the housing 2 and is capable of changing a discharge amount of the gas in the circulation path 21 per unit time is installed at a predetermined location of the discharge pipe 22*d*, As a result, it is possible to perform a process of adjusting an oxygen concentration in the internal space of the housing 2 by appropriately supplying and discharging the nitrogen gas to and from the circulation path 21 (also referred to as in-housing purge process or an EFEM purge process). For example, when the oxygen concentration in the circulation path 21 rises, the oxygen concentration can be lowered by temporarily supplying a large amount of the nitrogen gas from the supply source 50 to the circulation path 21 via the supply path 51 (including the sub supply path 52), and discharging the oxygen together with the nitrogen gas through the discharge pipe 22*d*. The control part 1C is electrically connected to an oxygen concentration meter 2*e*, a pressure meter 2*f*, a hygrometer 2*g*, and the like, which are installed in the housing 2, and is configured to check information on an atmosphere inside the housing 2 by receiving measurement results of these measurement devices (In FIG. 1, for the sake of convenience of explanation, the oxygen concentration meter 2*e*, the pressure meter 2*f* and the hygrometer 2*g* are shown outside the housing 2 together with the control part 1C).

As shown in FIG. 1, the FOUP 4 mounted on the load port 3 includes a FOUP main body 42 capable of opening the internal space 4S only rearward through the loading/unloading port 41 and a FOUP door 43 capable of opening and closing the loading/unloading port 41 (equivalent to a "container door 43" of the present disclosure). The FOUP 4 is a known one which is provided with multi-stage slots therein, configured to be able to accommodate substrates W to be transferred, and configured to load and unload the substrates W through the loading/unloading port 41. On an upward surface of the FOUP main body 42, there is installed a flange portion 44 that is gripped by a device for automatically transferring the FOUP 4 (e.g., an OHT: Over Head Transport) or the like. The FOUP 4 is mounted on the mounting table 35 of the load port 3. A port (not shown) is installed on a bottom wall of the FOUP main body 42. The port is mainly composed of a hollow cylindrical grommet seal fitted into a port mounting through-hole formed in the bottom wall of the FOUP main body 42, and is configured to be capable of being opened and closed by a check valve.

As shown in FIG. 1, the load port 3 according to the present embodiment includes a plate-shaped frame 32 that constitutes a part of the front wall 2*a* of the housing 2 and has an opening portion 31 for opening the internal space (substrate transfer space 2Sa) of the housing 2, a load port door 33 that opens and closes the opening portion 31 of the frame 32, a door opening/closing mechanism 34 that opens the opening portion 31 of the frame 32 by moving the load port door 33 to a door opening position retracted toward the housing 2, and a mounting table 35 installed on the frame 32 in a substantially horizontal posture.

The frame 32 is arranged in an upright posture and has a substantially rectangular plate shape having an opening portion 31 having such a size that allows communication with the loading/unloading port 41 of the FOUP 4 mounted on the mounting table 35. FIG. 1 schematically shows the opening portion 31 of the frame 32.

The mounting base 35 is installed above a horizontal base 351 (support base) arranged in a substantially horizontal posture at a position slightly above a height direction center of the frame 32, and is capable of mounting the FOUP 4 in an orientation in which the FOUP door 43 for opening and closing the internal space 4S of the FOUP main body 42 faces the load port door 33. Further, the mounting table 35 is configured to move forward and backward with respect to the frame 32 between a predetermined docking position where the FOUP door 43 approaches the opening portion 31 of the frame 32 and a position where the FOUP door 43 is spaced apart from the frame 32 by a predetermined distance as compared with the docking position (see FIG. 1). In the present embodiment, in the front-rear direction X (see FIG. 1 and the like) in which the FOUP 4 mounted on the mounting table 35 and the frame 32 are arranged side by side, the FOUP 4 side is defined as a front side and the frame 32 side is defined as a rear side.

The load port door 33 is configured to be moved integrally with the FOUP door 43 by the door opening/closing mechanism 34 among a fully closed position where the load port door 33 closes the opening portion 31 of the frame 32 while maintaining an engagement state with the FOUP door 43, a door opening position where the load port door 33 retracts toward the housing 2 side from the fully closed position, and a fully opened position where the load port door 33 fully opens the opening space of the opening portion 31 rearward. As shown in FIG. 1, the load port door 33 and the door opening/closing mechanism 34 are arranged at positions overlapping the return path 22 of the circulation path 21 in a side view. However, in reality, the circulation paths 21 are installed at a predetermined pitch in a width direction of the housing 2, and the load port door 33 is configured to be moved integrally with the FOUP door 43 by the door opening/closing mechanism 34 in a space formed between the circulation paths 21 arranged side by side in the width direction and communicating with the substrate transfer space 2Sa. Therefore, the load port door 33 does not move together with the FOUP door 43 on the return path 22.

The load port 3 of the present embodiment is a bottom purge device 36 (equivalent to the "purge device" of the present disclosure) capable of injecting a purge gas made of an inert gas such as a nitrogen gas or the like into the internal space 4S of the FOUP 4 and replacing the gas atmosphere in the internal space 4S of the FOUP 4 with the purge gas. The bottom purge device 36 is provided with a plurality of purge nozzles 37 (gas supply/discharge devices) arranged at predetermined locations on the mounting table 35 in a state in which upper end portions of the purge nozzles 37 can be exposed. These purge nozzles 37 are attached to appropriate positions on the mounting table 35 according to the positions of the ports installed on the bottom surface of the FOUP 4, and can be connected in contact with the ports. In the bottom purge process using the bottom purge device 36 (corresponding to the "purge process" of the present disclosure), a predetermined number (excluding all) of the ports installed on the bottom of the FOUP 4 are caused to function as "supply ports" to inject an appropriately selected purge gas such as a nitrogen gas, an inert gas, or a dry air into the FOUP 4 by the purge nozzles 37 connected to the supply ports, and the remaining ports are caused to function as "exhaust ports" to discharge a gas atmosphere in the FOUP 4 through the purge nozzles 37 connected to the purge ports, whereby the FOUP 4 is filled with the purge gas. Each load port 3 includes a supply path 61 for supplying the nitrogen gas to the purge nozzles 37 connected to the supply ports. As shown in FIG. 2, the supply path 61 is connected to the nitrogen gas supply source 60 for the bottom purge process. In addition, "LP Purge" in FIG. 2 means a load port purge, and indicates that the supply source 60 is a supply source of the nitrogen gas used for the bottom purge process. At predetermined locations of the supply path 61, there are installed an MFC (Mass Flow Controller) 61*a* for measuring and controlling a flow rate in the supply path 61, which is a gas flow path, and a supply valve 61*b* capable of changing a gas supply amount per unit time. Further, a discharge pipe (not shown) for discharging the gas in the FOUP 4 is connected to the purge nozzles connected to the exhaust ports.

As shown in FIG. 1, the substrate transfer robot R includes a base portion R1 fixed in the substrate transfer space 2Sa and an arm R2 whose base end portion is rotatably supported by the base portion R1. The substrate transfer robot R is an articulated robot in which a plurality of arm elements R3, R4 and R5 and hands R6 constituting the arm R2 are connected so as to be able to rotate sequentially. The arm R2 of the present embodiment includes three arm elements R3, R4, and R5 and two (two-stage) hands R6. The hand R that holds the substrate W is horizontally moved by rotating the arm elements R3, R4, and R5. The number of arm elements and hands is not limited thereto. The arm elements R3, R4, and R5 are arranged from below in the named order. Specifically, a base end portion of the lowermost arm element R3 is rotatably connected to the base portion R1. A base end portion of the middle arm element R4 is rotatably connected to a leading end portion of the lowermost arm element R3. A base end portion of the uppermost arm element R5 is rotatably connected to a leading end portion of the middle arm element R4. The robot hand R6 is rotatably connected to a leading end portion of the uppermost arm element R5.

Internal spaces R3*a*, R4*a*, and R5*a* of the arm elements R3, R4 and R5 communicate with each other through a predetermined gap. The substrate W can be held by the robot hand R6 by operating a mechanical component such as a cylinder R7 built in the robot hand R6. The rod (not shown) of the cylinder R7 is configured to expand and contract in a predetermined direction by supplying a nitrogen gas from a supply source (not shown) different from the above-mentioned supply source 50.

The EFEM 1 includes an ejector R8 installed inside the substrate transfer robot R to suck and remove particles generated by an operation of the cylinder R7. Then, by supplying the nitrogen gas from the supply source 50 to the ejector R8 through the supply path 53, the particles generated by an operation of mechanical parts such as the cylinder and the like are sucked through the suction path 531. The nitrogen gas supplied to the ejector R8 flows together with the sucked particles to an appropriate path (connection path R12 described later) and flows out to the return path 22. That is, the nitrogen gas flows into the circulation path 21 without being discharged to an external space of the housing 2 as it is. In this way, the ejector R8 sucks the particles generated in the vicinity of the cylinder R7, and the nitrogen gas supplied from the supply source 50 is discharged to the return path 22 together with the particles, so that the nitrogen gas circulates as it is. Further, the particles are removed by the FFU 23. Therefore, it is possible to suppress an increase in cost due to replenishment of the nitrogen gas as compared with a configuration in which vacuum-exhaust is performed. In the present embodiment, the supply source 50 that supplies the nitrogen gas to the ejector R8 is made the same as the supply source 50 that supplies the nitrogen gas into the circulation path 21 (the supply source is shared), and a supply valve 53*b* for switching an on/off of supply of the nitrogen gas to the ejector R8 is installed on a predetermined location of the supply path 53. The "FM" shown in FIG. 2 is a flow meter 53*a*. The supply path 53 to the ejector R8 branches from a predetermined location on a further upstream side than the MFC 51*a* and the supply valve 51*b* in the supply path 51 which functions as a gas supply path during the above-mentioned in-housing purge process.

A delivery port R11 for delivering the nitrogen gas to the circulation path 21 is formed at a predetermined location on the base portion R1 of the transfer robot R. The delivery port R11 is connected to the return path 22 by a connection path R12. A fan R13 that rotates at a constant rotational speed is installed in the vicinity of the delivery port R11. The EFEM 1 of the present embodiment includes a supply path 54, which passes through the internal space R1*a* of the base portion R1 and the internal spaces R3*a*. R4*a*, and R5*a* of the arm elements R3, R4 and R5. A leading end portion of the supply path 54 is arranged in the internal space R5*a* of the uppermost arm element R5. When an inert gas such as a nitrogen gas or the like is supplied from the supply source 50 to the supply path 54, the inert gas passes through the supply path 54 and is supplied to the internal space R5*a* of the uppermost arm element R5. Subsequently, the inert gas flows into the internal space R4*a* of the middle arm element R4, the internal space R3*a* of the lowermost arm element R3, and the internal space R1*a* of the base portion R1 in the named order. The inert gas is delivered to the return path 22 through the delivery port R11 of the base portion R1. As a result, the gas in the internal space of the transfer robot R (an internal space R1*a* of the base portion R1, and internal spaces R3*a*, R4*a*, and R5*a* of the arm elements R3, R4, and R5) can be replaced with the inert gas such as a nitrogen gas or the like.

As described above, the EFEM 1 of the present embodiment is provided with an in-transfer robot purge device R9 for replacing the gas in the internal space of the transfer robot R (the internal space R1*a* of the base portion R1, and the internal spaces R3*a*, R4*a*, and R5*a* of the arm elements R3, R4, and R5) with the inert gas such as a nitrogen gas or the like. Therefore, even if particles are generated in the internal space of the transfer robot R (the internal space R1*a* of the base portion R1, and the internal spaces R3*a*, R4*a*, and R5*a* of the arm elements R3, R4 and R5), it is possible to suppress leakage of the particles into the substrate transfer space 2Sa. Furthermore, the particles discharged to the return path 22 are removed by the FFU 23 arranged at the downstream of the return path 22. Therefore, it is possible to suppress contamination of the substrate transfer space 2Sa by the particles generated in the internal space of the substrate transfer robot R (the internal space R1*a* of the base portion R1, and the internal spaces R3*a*, R4*a*, and R5*a* of the arm elements R3, R4, and R5). In the present embodiment, the supply source 50 for supplying the nitrogen gas to the purge device R9 in the transfer robot is the same as the supply source 50 for supplying the nitrogen gas to the circulation path 21 (the supply source is shared), and the supply valve 54*b* for switching an on/off of supply of the nitrogen gas is installed on a predetermined location of the supply path 54. The supply path 54 to the in-transfer robot purge device R9 branches from a predetermined location on a further upstream than the MFC 51*a* and the supply valve 51*b* in the supply path 51 which functions as a gas supply path during the above-described in-housing purge process.

Each of the ejector R8 and the purge device R9 in the transfer robot described above corresponds to an "in-transfer robot inert gas supply device for supplying the inert gas to the internal space of the substrate transfer robot" in the present disclosure.

As shown in FIG. 1, the EFEM 1 of the present embodiment includes an aligner 7 installed in the substrate transfer space 2Sa and configured to detect an amount of deviation of a holding position of the substrate W held by the arm R2 of the transfer robot R from a target holding position and perform position correction (alignment) for correcting the position deviation. The aligner 7 includes an alignment table 71 on which the substrate W to be aligned is placed. The through-hole 73 formed in a side wall of an alignment case 72 containing a mechanism for rotating the alignment table 71 is connected to the return path 22 through a connection path 74. In the present embodiment, a fan 75 is installed in the vicinity of the through-hole 73 of the alignment case 72. When the fan 75 is rotationally driven, it is configured such that the gas inside the alignment case 72 is discharged together with the particles generated inside the alignment case 72 toward the connection path 74.

The EFEM 1 of the present embodiment includes an ionizer 8 that blows a nitrogen gas, which is an ionizing air, from above to the substrate placed on the alignment table 71. The ionizer 8 is connected to the supply path 55 through which the inert gas supplied from the supply source 50 flows. The ionizer 8 can neutralize/remove (discharge) a static electricity charged on the substrate W by spraying the inert gas (ionizing air) supplied from the supply source 50 toward the substrate W placed on the alignment table 71. In the present embodiment, as shown in FIG. 2, the supply source 50 for supplying the nitrogen gas to the ionizer 8 is the same as the supply source 50 for supplying the nitrogen gas into the circulation path 21 (the supply source is shared). A supply valve 55*b* for switching an on/off of supply of the nitrogen gas to the ionizer 8 is installed on a predetermined location of the supply path 55. "FM" shown in FIG. 2 is a flow meter 55*a*. The supply path 55 to the ionizer 8 branches from a predetermined location from a further upstream than the MFC 51*a* and the supply valve 51*b* in the supply path 51 which functions as a gas supply path during the above-described in-housing purge process.

Next, the operation flow of EFEM 1 will be described. First, the FOUP 4 is transferred to an upper portion of the load port 3 by a container transfer device such as an OHT or the like and is mounted on the mounting table 35. At this time, for example, a positioning protrusion installed on the mounting table 35 is fitted into a positioning recess of the FOUP 4, thereby bringing locking claws on the mounting table 35 into a locked state (locking process). In the present embodiment, three FOUPs 4 can be mounted on the mounting tables 35 of the load ports 3 arranged side by side in the width direction of the housing 2. Further, a seat sensor (not shown) for detecting whether or not the FOUP 4 is mounted on the mounting table 35 at a predetermined position is configured to detect that the FOUP 4 is mounted on the mounting table 35 at a normal position.

In the load port 3 of the present embodiment, when the FOUP 4 is mounted on the mounting table 35 at the normal position, it is detected that the bottom portion of the FOUP 4 presses a pressed portion of a pressure sensor installed on the mounting table 35. Thus, the purge nozzles 37 (all the purge nozzles 37) installed on the mounting table 35 are moved upward from the upper surface of the mounting table 35 and are connected to the respective ports of the FOUP 4. Each port is switched from a closed state to an opened state. Then, the load port 3 of the present embodiment performs a process (bottom purge process) in which a nitrogen gas is supplied to the internal space 4S of the purge FOUP 4 by the bottom purge device 36 to replace the internal space 4S of the FOUP 4 with the nitrogen gas. During the bottom purge process, the gas atmosphere inside the FOUP 4 is discharged out of the FOUP 4 through the purge nozzles 37 connected to ports functioning as exhaust ports. By such a bottom purge process, moisture concentration and oxygen concentration in the FOUP 4 are lowered to predetermined value or less, respectively, so that the surrounding environment of the substrates W in the FOUP 4 becomes a low-humidity and low-oxygen environment. An amount of the nitrogen gas supplied to the internal space 4S of the FOUP 4 during the bottom purge process can be changed by the bottom purge MFC 61*a*, and a supply flow rate of the nitrogen gas can be changed according to the moisture concentration and oxygen concentration in the FOUP 4.

The load port 3 of the present embodiment brings the FOUP door 43 and the frame 32 into close contact with each other by moving the mounting table 35 from a position shown in FIG. 1 to a predetermined docking position after the locking process. Then, a process (door opening process) is performed in which the FOUP door 43 is moved together with the load port door 33 to open the opening portion 31 of the frame 32 and the loading/unloading port 41 of the FOUP 4 to thereby release the closed state of the FOUP 4. By performing the door opening process, the internal space 4S of the FOUP main body 42 and the substrate transfer space 2Sa of the housing 2 are brought into communication with each other. Then, a process (transfer process) is performed in which the substrate transfer robot R installed in the substrate transfer space 2Sa of the housing 2 takes out the substrate W from a slot of the FOUP main body 42 or stores the substrate W in a specific slot.

In the load port 3 according to the present embodiment, when all the substrates W in the FOUP 4 have been processed by the processing apparatus M, a process (door closing process) is performed in which the load port door 33 is moved to the fully closed position by the door opening/closing mechanism 34, and the opening portion 31 of the frame 32 and the loading/unloading port 41 of the FOUP 4 are closed to seal the internal space 4S of the FOUP 4. By the above process, the opening portion 31 of the frame 32 and the loading/unloading port 41 of the FOUP 4 are closed by the load port door 33 and the FOUP door 43, respectively, so that the internal space 4S of the FOUP 4 is sealed.

Subsequently, the load port 3 according to the present embodiment moves the mounting table 35 away from the frame 32 to release the locked state of the FOUP 4. As a result, the FOUP 4 storing the substrates W that have been subjected to the predetermined processes is delivered from the mounting table 35 of each load port 3 to the container transfer device and is transferred to the next process.

In the EFEM 1 according to the present embodiment, which undergoes such an operation flow, the bottom purge process, which is executed before the door opening process, is continuously performed after the door opening process, which makes it possible to prevent or suppress the deterioration of the substrates waiting in the FOUP 4. On the other hand, if the bottom purge process is continued after the door opening process, the nitrogen gas, which is the purge gas, may flow into the housing 2 from the FOUP 4, thereby increasing the pressure in the housing 2. In order to avoid such a situation, the EFEM 1 according to the present embodiment is configured so that the amount of the inert gas supplied into the housing 2 is controlled by the control part 1C. Specifically, the control part 1C is configured to control the amount of the inert gas supplied into the housing 2 based on an inert gas supply amount command value.

Figure 3:
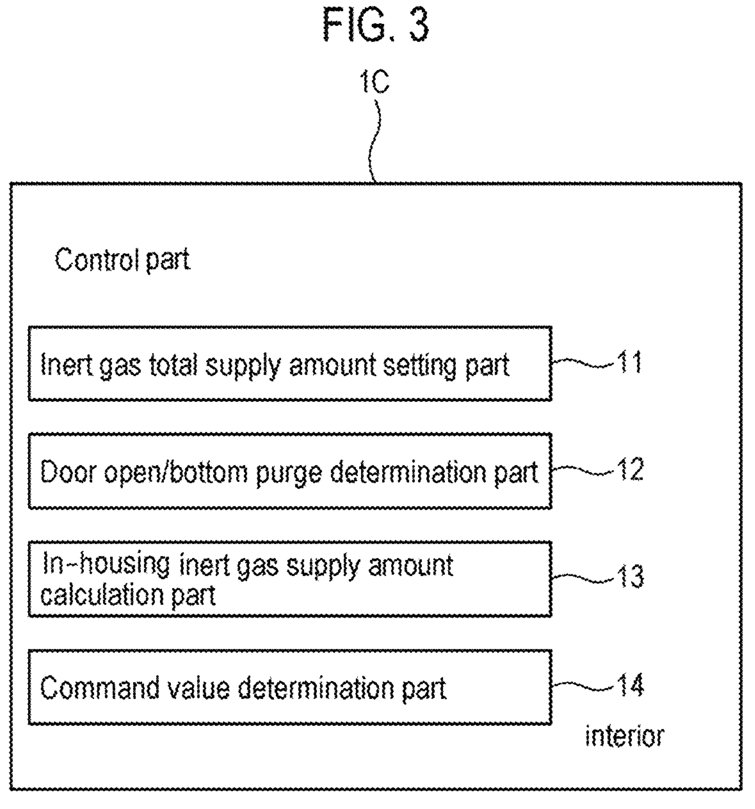
FIG. 3 is a functional block diagram of a control part according to the embodiment.

As shown in FIG. 3, the control part 1C includes an inert gas total supply amount setting part 11, a door open/bottom purge determination part 12 (corresponding to the "door open/purge determination part" of the present disclosure), an in-housing inert gas supply amount calculation part 13, and a command value determination part 14.

The inert gas total supply amount setting part 11 sets the total amount of the inert gas to be supplied into the housing 2 based on the oxygen concentration in the housing 2. In the present embodiment, as shown in FIG. 4, the total amount of the inert gas to be supplied into the housing 2 according to the oxygen concentration in the housing 2 is stored as an oxygen concentration control table in a predetermined storage area of the control part 1C.

The door open/bottom purge determination part 12 determines whether the container door 43 of the FOUP 4, which is mounted on the mounting table 35 of the load port 3, is in an open state and whether a bottom purge process is being formed by the bottom purge device, for each load port 3. Whether the container door 43 of the FOUP 4 is in an open state can be determined by an appropriate sensor (e.g., a U-shaped micro photo sensor) installed near the container door 43 of the FOUP 4 in the load port 3. Whether the bottom purge process is being performed by the bottom purge device 36 can be determined by an appropriate sensor (such as a gas flow meter or the like) installed in association with the bottom purge device 36. Since the EFEM 1 of the present embodiment has three load ports 3, the determination process by the door open/bottom purge determination part 12 is performed for the respective load ports 3 (three times in total).

When the determination result of the door open/bottom purge determination part 12 is "Yes," the in-housing inert gas supply amount calculation part 13 calculates the amount of the inert gas to be supplied into the housing 2 based on a value obtained by subtracting the supply amount of the bottom purge inert gas to the FOUP 4 by the bottom purge device 36 of the load port 3 (corresponding to the "in-housing inert gas supply amount" of the present disclosure) from the inert gas supply amount set by the inert gas total supply amount setting part 11. The supply amount of the bottom purge inert gas to the FOUP 4 by the bottom purge device 36 is a value that varies according to the oxygen concentration in the FOUP 4, the bottom purge process duration time, or the like. The value (bottom purge inert gas supply amount) is based on a command value of the bottom purge MFC 61*a*. Therefore, by specifying the command value of the bottom purge MFC 61*a* with an appropriate means, it is possible to specify the supply amount of the bottom purge inert gas to the FOUP 4 by the bottom purge device 36 and to use the specified value for the calculation process in the in-housing inert gas supply amount calculation part 13. Further, when the determination result of the door open/bottom purge determination part 12 is "No" (when the container door 43 of the FOUP 4 mounted on the mounting table 35 of the load port 3 is in a closed state, or when the bottom purge process by the bottom purge device 36 is not being performed), the in-housing inert gas supply amount calculation part 13 calculates the supply amount of the inert gas into the housing 2 by assuming that the value obtained by subtracting the bottom purge inert gas supply amount from the inert gas supply amount set by the inert gas total supply amount setting part 11 is zero (the supply amount of the bottom purge inert gas to the FOUP 4 by the bottom purge device 36 of the load port 3 is zero).

Further, when the in-transfer robot inert gas supply device is supplying an inert gas, the in-housing inert gas supply amount calculation part 13 is configured to calculate the supply amount of the inert gas into the housing 2 by also subtracting the supply amount of the inert gas by the in-transfer robot inert gas supply device from the total inert gas supply amount set by the inert gas total supply amount setting part 11. In the present embodiment, each of the ejector R8 and the in-transfer robot purge device R9 corresponds to the in-transfer robot insert gas supply device. When the ejector R8 is supplying an inert gas, the in-housing inert gas supply amount calculation part 13 is configured to calculate the supply amount of the inert gas into the housing 2 by subtracting the inert gas supply amount of the ejector R8 from the total inert gas supply amount. When the in-transfer robot purge device R9 is supplying an inert gas, the in-housing inert gas supply amount calculation part 13 is configured to calculate the supply amount of the inert gas into the housing 2 by subtracting the inert gas supply amount of the in-transfer robot purge device R9 from the total inert gas supply amount.

Further, in the present embodiment, when the ionizer 8 is supplying an inert gas, the in-housing inert gas supply amount calculation part 13 is configured to calculate the supply amount of the inert gas into the housing 2 by subtracting the inert gas supply amount of the ionizer 8 from the total inert gas supply amount.

In this regard, a column C in the oxygen concentration control table of FIG. 4 is a column regarding the inert gas supply amount of the "Robot Ejector" (ejector R8), a column D is a column regarding the inert gas supply amount of the "Robot Inner Purge" (in-transfer robot purge device R9), and a column E is a column regarding the inert gas supply amount of the "Ionizer Purge" (ionizer 8). Further, a column B in the oxygen concentration control table is a column regarding the "Main Purge," that is, the supply amount of the inert gas into the housing 2 through the sub-supply path 52 described above. The supply amounts of these columns B to E are not variable depending on the value of the oxygen concentration in the housing 2 (the oxygen concentration in the EFEM), but are zero or a constant value (fixed value).

The command value determination part 14 determines the calculation result of the in-housing inert gas supply amount calculation part 13 as an inert gas supply amount command value of an inert gas into the housing 2. In the present disclosure, when changing (updating) the supply amount of the inert gas into the housing 2 to the inert gas supply amount command value determined based on the calculation result of the in-housing inert gas supply amount calculation part 13, that is, when updating the current inert gas supply amount command value to the latest inert gas supply amount command value (the latest inert gas supply amount command value determined by the command value determination part 14), the current inert gas supply amount command value is gradually changed to the latest inert gas supply amount command value over a predetermined period of time.

When the EFEM 1 of the present embodiment starts to operate by turning on the power, the EFEM 1 enters a maintenance mode in which an air replacement process inside the housing 2 is performed. In this maintenance mode, air replacement is performed so that the oxygen concentration in the housing 2 is changed from less than 19.5% to 19.5% or more. The EFEM 1 shifts from the maintenance mode to a transfer mode, and further shifts from the transfer mode to an oxygen concentration control transfer mode. In the oxygen concentration control transfer mode, inert gas supply control (in-housing oxygen concentration control) is performed by the control part.

When the shift to the oxygen concentration control transfer mode is started, the EFEM 1 monitors the value of the oxygen concentration meter 2*e* installed at an appropriate location in the housing 2 and controls the oxygen concentration to be constant (transfer chamber oxygen concentration control).

As described above, the oxygen concentration control table shown in FIG. 4 is stored in advance in a predetermined storage area of the control part 1C. Then, the calculation process by the following equation 1 is performed once per second according to the oxygen concentration. According to the calculation result, the supply amount of the inert gas to the housing 2 as a control target, specifically the flow rate of the inert gas to the in-housing purge MFC 51*a*, which is installed at a predetermined location of the supply path 51 for supplying the nitrogen gas into the circulation path 21 of the housing 2, is set.

$$A(LPM)=T-(B+C+D+E+F+G+H) \qquad \text{Equation 1}$$

where A to H in Equation 1 are synonymous with A to H in the oxygen concentration control table of FIG. 4. A is the supply amount of the inert gas into the housing 2 as a control target (EFEM MFC Purge), which is a control target, specifically the flow rate command value of the in-housing purge MFC 51*a*, and the unit is LPM (liter/minute). T is the total inert gas supply amount (total $N_2$ supply amount (LPM)) of the inert gas into the housing 2, which is preset according to the oxygen concentration in the housing 2. B, C, D, and E in Equation 1 are the main purge inert gas supply amount (Main Purge (LPM)), the ejector inert gas supply amount (Robot Ejector (LPM)), the transfer robot inner purge inert gas supply amount (Robot Inner Purge (LPM)), and the ionizer inert gas supply amount (Ionizer Purge (LPM)), respectively. F, G, and H in Equation 1 are the inert gas supply amounts (LP-1MFC Purge (LPM), LP-2 MFC Purge (LPM), LP-3 MFC Purge (LPM)) of the bottom purge devices 36 of the first load port, the second load port, and the third load port, respectively. Columns N and T in the oxygen concentration control table are individual parameters, and columns B to E are parameters for each column. The oxygen concentration control table shown in FIG. 3 indicates an example of default values.

In the present embodiment, when "A<5," the flow rate in the in-housing purge MFC 51*a* is set to 5 LPM. This is because the in-housing purge MFC 51*a* has a control range of 4 to 200 LPM and, for example, the flow rate of 2 LPM cannot be controlled by the MFC 51*a*. In particular, when the flow rate is set to 0 (zero) LPM, since it is necessary to close the in-housing purge supply valve 51*b*, and it is expected that the valve on/off operation will be repeated at the concentration boundary, the control range is to avoid repetition of the valve on/off operation.

Figure 5:
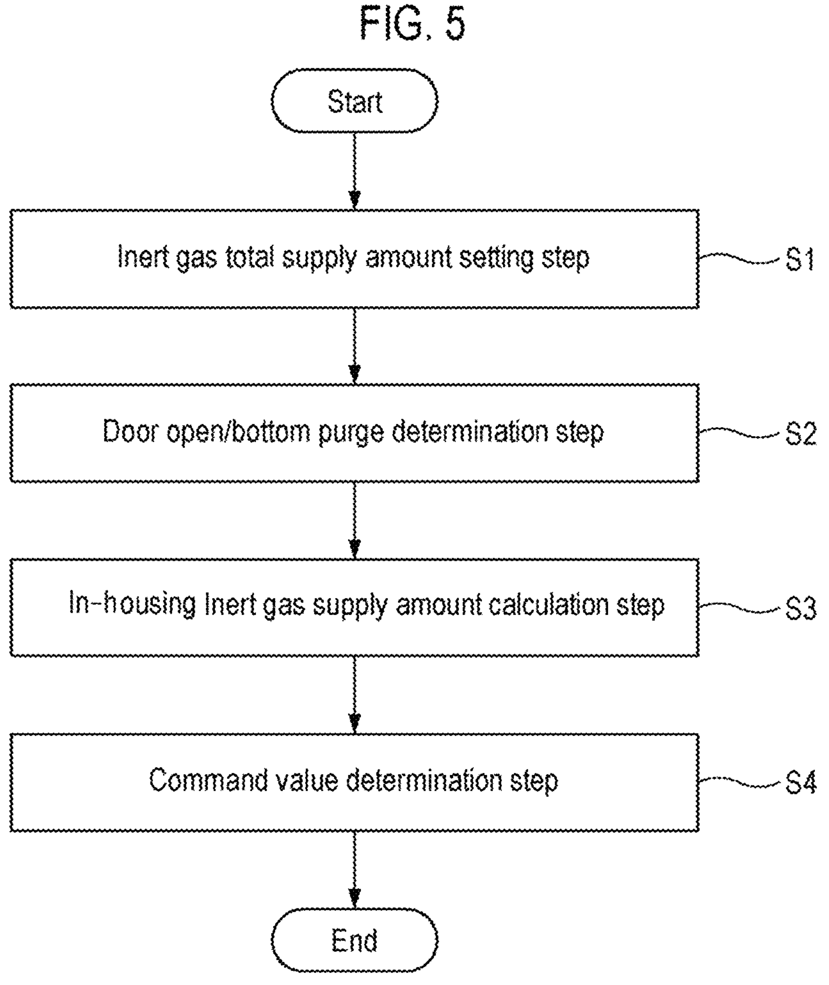
FIG. 5 is a flowchart (simplified version) of controlling an in-housing inert gas supply amount according to the embodiment.

Next, the in-housing oxygen concentration control (in-housing inert gas supply amount control) in which the control part 1C performs the calculation process of the above Equation 1 to control the supply amount of the inert gas into the housing 2 will be described with reference to the simplified flow chart shown in FIG. 5 and the detailed flow chart shown in FIG. 6.

Figure 6:
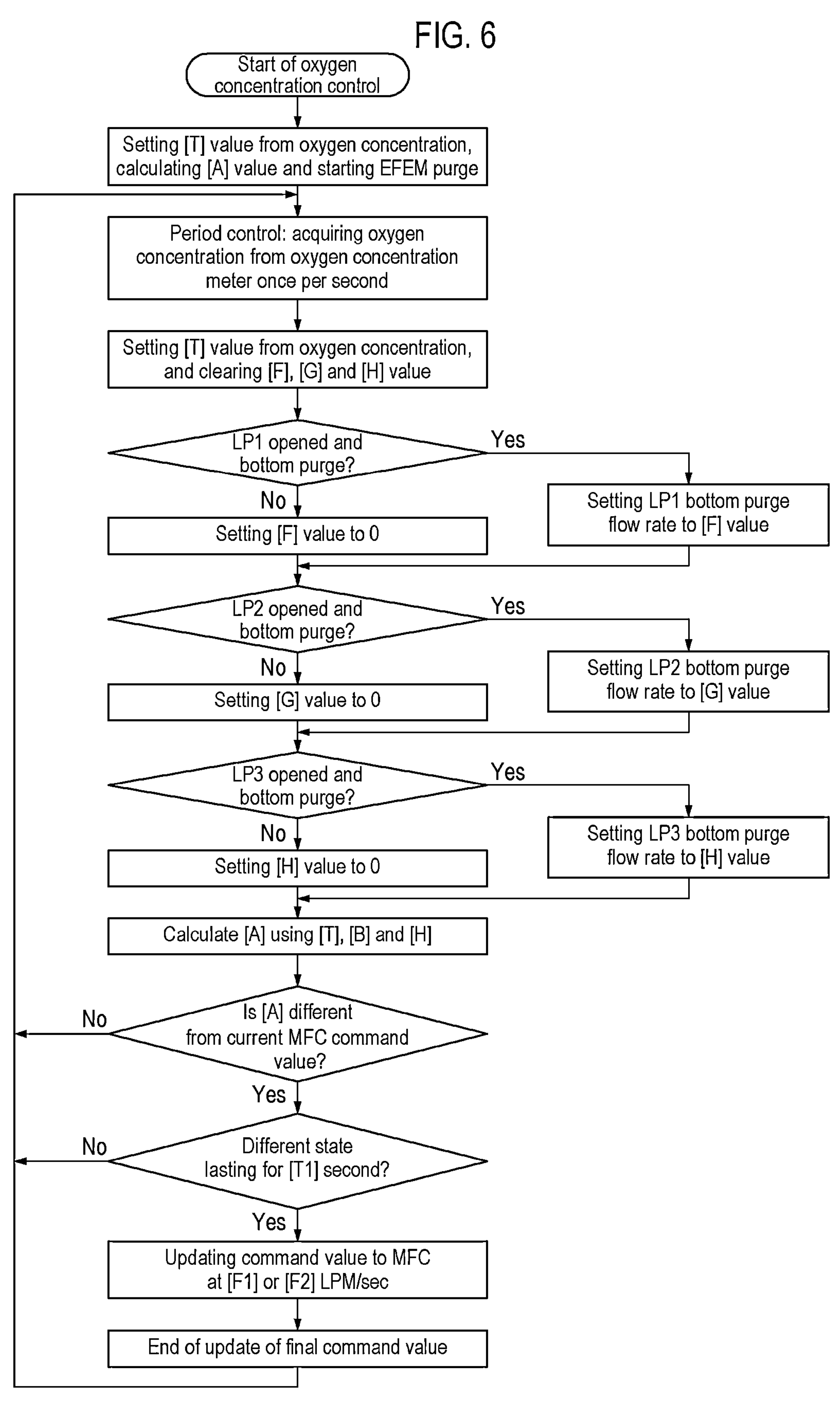
FIG. 6 is a flowchart (detailed version) of controlling an in-housing inert gas supply amount according to the embodiment.

In the EFEM 1 of the present embodiment, first, the control part causes the inert gas total supply amount setting part 11 to set the total amount of inert gas [T] (total inert gas supply amount) to be supplied into the housing 2 (inert gas total supply amount setting step S1) (see FIG. 6). Specifically, by referring to the oxygen concentration control table, the inert gas total supply amount [T] is set based on the oxygen concentration in the housing 2. At this time, [F], [G], and [H] in Equation 1, that is, the values of the supply amount of the bottom purge inert gas to the FOUP 4 by the bottom purge device 36 of each load port 3 are cleared (it becomes a state that the values are not given).

Next, the control part 1C causes the door open/bottom purge determination part 12 to determine whether the container door 43 of the FOUP 4, which is mounted on the mounting table of the load port 3, is in an open state and whether the bottom purge process is being performed by the bottom purge device 36 (door open/bottom purge determination step S2 corresponding to the "door open/purge determination step" of the present disclosure), for each load port 3. In the EFEM 1 of the present embodiment, the door open/bottom purge determination step S2 is sequentially performed for all three load ports.

When the determination result in the door open/bottom purge determination step S2 is "Yes," the control part 1C causes the in-housing inert gas supply amount calculation part 13 to calculate the supply amount [A] of the inert gas supplied into the housing 2, based on the value obtained by subtracting the supply amounts [F], [G], and [H] of the bottom purge inert gas into the FOUP 4 by the bottom purge device 36 of the load port 3 from the inert gas total supply amount [T] (in-housing inert gas supply amount calculation step S3). Further, when the determination result in the door open/bottom purge determination step S2 is "No," in the inert gas supply amount calculation step S3, the supply amount [F] of the bottom purge inert gas to the FOUP 4 by the bottom purge device 36 of the load port 3 (e.g., the first load port 3) is set to zero to calculate the supply amount [A] of the inert gas into the housing 2. FIG. 7 shows an example of the oxygen concentration control table when the determination result of the door open/bottom purge determination part 12 is "Yes" (the container door 43 of the FOUP 4 mounted on the mounting table 35 is in an open state and the bottom purge process is being performed by the bottom purge device 36) for the first load port 3 among the three load ports 3 and the determination result of the door open/bottom purge determination part 12 is "No" for the second and third load ports 3.

Further, in the in-housing inert gas supply amount calculation step S3, when the in-transfer robot inert gas supply device (the ejector R8 or the transfer robot purge device R9) is supplying the inert gas, or when the ionizer 8 is supplying the inert gas, the supply amount of the inert gas into the housing 2 is calculated by subtracting the inert gas supply amounts [C] and [D] of the in-transfer robot inert gas supply device (the ejector R8 or the transfer robot purge device R9) and the inert gas supply amount [E] from the inert gas total supply amount [T]. The oxygen concentration control table shown in FIG. 7 is the one available when the container door 43 of the FOUP 4 mounted on the mounting table 35 of the first load port is in an open state and the bottom purge process is being executed by the bottom purge device 36 at a flow rate of 50 MLP. As can be understood from FIG. 7, for example, when the oxygen concentration in the housing 2 is 100 ppm, the inert gas total supply amount [T] is set to 310 LPM by the inert gas total supply amount setting step S1. In the in-housing inert gas supply amount calculation step S3, by performing a process of subtracting the supply amount [F] of the bottom purge inert gas to the FOUP 4 by the bottom purge device 36 of the first load port 3, that is, (LPM) from the total inert gas supply amount (LPM), the supply amount [A] of the inert gas into the housing 2 is reduced by 50 LPM as compared with a case where the bottom purge process is not being performed by the bottom purge devices 36 of all the load ports 3 (FIG. 4).

Next, the control part 1C causes the command value determination part 14 to determine the calculation result of the in-housing inert gas supply amount calculation part 13 as an inert gas supply amount command value [A] (command value determination step S4). Then, when the inert gas supply amount command value [A] determined in the command value determination step S4 is different from the current inert gas supply amount command value (the current flow rate command value to the in-housing purge MFC 51*a*: [A current], and "Current MFC command value" in FIG. 6), that is, when the inert gas supply amount command value [A] exceeds the boundary value for switching the inert gas total supply amount [T] for the oxygen concentration specified in the oxygen concentration control table, it is determined whether a different state has continued for "T1" seconds. "T1" is the time for determining that the flow rate boundary has been stably crossed. The default value of "T1" is set to 20 seconds in the present embodiment. That is, when the current inert gas supply amount command value [A current] and the inert gas supply amount command value [A] determined in the command value determination step S4 are different, if the current inert gas supply amount command value [A current] and the inert gas supply amount command value [A] determined in the command value determination step S4 continue to be different for "T1" seconds, it is determined that the boundary of the flow rate has been stably crossed, and the command value of the in-housing purge MFC 51*a* is updated as the inert gas supply amount command value [A] determined in the command value determination step S4. This is to avoid a situation in which automatic pressure control is destabilized due to a change in the inert gas flow rate caused by fluctuations in the oxygen concentration value at the boundary of switching of the inert gas supply amount with respect to the oxygen concentration.

If the determination result indicates that the current inert gas supply amount command value [A current] and the inert gas supply amount command value [A] determined in the command value determination step S4 continue to be different for "T1" seconds, the inert gas supply amount command value to the in-housing purge MFC 51*a* is updated, the update of the final inert gas supply amount command value is completed, and the flow rate control for the in-housing purge MFC 51*a* is performed based on the updated inert gas supply amount command value. Thereafter, the above-described procedure is repeated until a predetermined time elapses or a predetermined process is completed. In the present embodiment, when updating the inert gas supply amount command value, that is, when updating the command value determined in the command value determination step S4 as the latest inert gas supply amount command value, the command value is gradually updated over a predetermined period of time. Specifically, when the oxygen concentration control transfer mode has already been entered, the inert gas supply amount command value is updated to [F2] LPM/sec. When the oxygen concentration control transfer mode is being entered, the inert gas supply amount command value is updated to [F1] LPM/sec. In the present embodiment, [F2] is set to a value relatively smaller than [F1], and the amount of change per second (LPM/sec) when updating the inert gas supply amount command value is set to be small. As a result, after shifting to the oxygen concentration control transfer mode, the change is relatively gentler than that during the shift to the oxygen concentration control transfer mode. For example, when changing (updating) the inert gas supply amount command value from 200 LPM to 150 LPM after shifting to the oxygen concentration control transfer mode, that is, when decreasing the flow rate setting value to the in-housing purge MFC 51*a* by 50 LPM, the flow rate is gradually changed by 2 LPM per second for a total of 25 seconds so that the pressure in the housing 2 does not fluctuate rapidly, and an opening degree of the exhaust valve of the exhaust pipe 22*d* is adjusted according to the supply amount of the inert gas.

As described above, according to the EFEM 1 of the present embodiment, the supply amount of the inert gas into the housing 2 is set based on the oxygen concentration in the housing 2. When the bottom purge process is being performed by the bottom purge device 36 with the container door 43 opened (when the determination result of the door open/bottom purge determination part 12 is "Yes"), the inert gas supply amount (bottom purge inert gas supply amount) used for the bottom purge process is subtracted from the total inert gas supply amount, the inert gas supply amount command value, which is the command value of the amount of the inert gas supplied into the housing 2, is calculated based on the subtracted value, and the supply amount of the inert gas into the housing 2 is controlled based on the inert gas supply amount command value. As a result, in consideration of the inert gas supply amount used during the execution of the bottom purge process, the inert gas supply amount can be controlled so as not to exceed the upper limit of the entire gas supply amount to the EFEM 1 (the total inert gas supply amount set based on the oxygen concentration in the housing 2). By avoiding the wasteful use of the inert gas in which the inert gas is discharged from the housing 2 even when the oxygen concentration remains unchanged, it is possible to always keep the pressure in the housing 2 of the EFEM 1 at a slightly positive pressure with a specified amount of use of the inert gas while saving the inert gas.

In particular, in the EFEM 1 according to the present embodiment, when changing the supply amount of the inert gas into the housing 2 to the inert gas supply amount command value determined based on the calculation result of the in-housing inert gas supply amount calculation part 13 (when updating the inert gas supply amount command value determined based on the calculation result of the in-housing inert gas supply amount calculation part 13 as the latest inert gas supply amount command value) during the execution of the control of inert gas supply into the housing 2, the supply amount of the inert gas into the housing 2 is gradually changed over a predetermined period of time, so that this makes it possible to prevent or suppress a sudden pressure change in the housing 2.

In addition, in case that the EFEM 1 according to the present embodiment is configured to include the in-transfer robot inert gas supply device (an ejector R8 or an in-transfer robot purge device R9) which supplies an inert gas into the substrate transfer robot R arranged in the substrate transfer space 2Sa, or configured to include an ionizer 8 which locally supplies an inert gas to the substrate placed at a predetermined location in the substrate transfer space 2Sa to eliminate static electricity from the substrate, the inert gas supply amount command value is calculated and determined in consideration of these inert gas supply amounts. Therefore, the inert gas supply amount can be controlled so as not to exceed the upper limit of the entire gas supply amount to the entire EFEM 1 (the total inert gas supply amount set based on the oxygen concentration in the housing 2). By avoiding the wasteful use of the inert gas, it is possible to always keep the pressure in the housing 2 of the EFEM 1 at a slightly positive pressure with a specified amount of use of the inert gas.

As described above, the inert gas supply amount control method according to the present embodiment is a method of controlling the supply amount of the inert gas into housing 2, based on the command value determined through the inert gas total supply amount setting step S1, the door open/bottom purge determination step S2, and the in-housing inert gas supply amount calculation step S3. Therefore, it is possible to avoid a situation in which the nitrogen gas is supplied to the housing 2 in excess of the initial control amount, and it is possible to always keep the pressure in the housing 2 of the EFEM 1 at a slightly positive pressure with a specified amount of use of the inert gas while saving the inert gas.

Although the embodiments of the present disclosure have been described above, the present disclosure is not limited to the configurations of the above-described embodiments. For example, the parameters of the oxygen concentration control table shown in the above-described embodiments are one example. Specific numerical values and default values of the parameters may be changed and selected as appropriate.

In the above-described embodiments, the FOUP is used as the substrate storage container. However, in the present disclosure, it may be possible to use storage containers other than the FOUP, such as an MAC (Multi-Application Carrier), an H-MAC (Horizontal-MAC), an FOSB (Front Open Shipping Box), and the like.

In the above-described embodiments, the nitrogen gas is used as an example of the inert gas used for the bottom purge process or the like. However, the inert gas is not limited thereto. It may be possible to use a desired gas such as dry gas, an argon gas, or the like. In the above-described embodiments, the configuration in which three load ports are connected to the front wall of the transfer chamber has been illustrated by way of example. It may be possible to adopt a configuration in which less than three or four or more load ports are connected to the front wall of the transfer chamber.

In addition, the specific configuration of each part is not limited to the above-described embodiments, and various modifications may be made without departing from the scope of the present disclosure.

According to the present disclosure, when supplying the inert gas such as a nitrogen gas or the like into the housing, it is configured such that the inert gas supply amount is controlled based on the value calculated by subtracting the supply amount of the gas into the substrate storage container by the load port purge device (in-container inert gas supply amount) from the gas supply amount that is the initial control amount into the housing. Therefore, it is possible to provide an EFEM capable of avoiding waste of an inert gas and keeping the pressure in the housing at a slightly positive pressure by using a specified amount of inert gas, and a method of controlling the supply of an inert gas into an EFEM.

While certain embodiments have been described, these embodiments have been presented by way of example only, and are not intended to limit the scope of the disclosures. Indeed, the embodiments described herein may be embodied in a variety of other forms. Furthermore, various omissions, substitutions, and changes in the form of the embodiments described herein may be made without departing from the spirit of the disclosures. The accompanying claims and their equivalents are intended to cover such forms or modifications as would fall within the scope and spirit of the disclosures.

What is claimed is:

1. An EFEM comprising:

a housing having a substrate transfer space in the housing;

a first supply part configured to supply gas into the housing via a first supply path;

at least one second supply part configured to supply gas into the housing via a second supply path different from the first supply path; and a control part configured to:

set a total supply amount of gas to be supplied into the housing based on an oxygen concentration in the housing;

determine whether the gas is supplied from the at least one second gas supply part into the housing;

in response to determining that the gas is supplied from the at least one second gas supply part into the housing, calculate a target supply amount of the gas to be supplied from the first gas supply part into the housing, based on a value obtained by subtracting a supply amount of the gas supplied from the at least one second gas supply part from the total supply amount of the gas; and control the first gas supply part according to a calculation result for the target supply amount of the gas to be supplied from the first gas supply part into the housing.

2. The EFEM of claim 1, wherein, when controlling the first gas supply part according to the calculation result, the control part controls the first gas supply part to gradually change a supply amount of the gas supplied from the first gas supply part over a predetermined period of time.

3. The EFEM of claim 1, wherein the first supply path includes a circulation path for circulating the gas, which is formed inside the housing.

4. The EFEM of claim 3, further comprising:

a fan filter unit (FFU) installed in an FFU installation space in the housing, which is located above the substrate transfer space and to which the first supply part supplies the gas, and configured to send the gas in the FFU installation space to the substrate transfer space;

a return path communicating with the substrate transfer space and the FFU installation space; and a fan installed in the return path and configured to suck the gas from the substrate transfer space to flow the FFU installation space, and wherein the circulation path includes the FFU installation space, the substrate transfer space, and the return path.

5. The EFEM of claim 1, further comprising a mounting table configured to mount a substrate storage container thereon, wherein the at least one second gas supply part includes a purge device configured to replace a gas atmosphere in the substrate storage container mounted on the mounting table with gas, and wherein the control part is configured to:

determine, for a load port adjacent to the housing, whether a container door of the substrate storage container mounted on the mounting table is in an open state and whether the purge device performs a purge process; and in response to determining that the container door is in the open state and the purge device performs the purge process, calculate the target supply amount of the gas to be supplied from the first gas supply part into the housing, based on a value obtained by subtracting a supply amount of the gas supplied from the purge device from the total supply amount of the gas.

6. The EFEM of claim 3, further comprising a mounting table configured to mount a substrate storage container thereon, wherein the at least one second gas supply part includes a purge device configured to replace a gas atmosphere in the substrate storage container mounted on the mounting table with gas, and wherein the control part is configured to:

determine, for a load port adjacent to the housing, whether a container door of the substrate storage container mounted on the mounting table is in an open state and whether the purge device performs a purge process; and in response to determining that the container door is in the open state and the purge device performs the purge process, calculate the target supply amount of the gas to be supplied from the first gas supply part into the housing, based on a value obtained by subtracting a supply amount of the gas supplied from the purge device from the total supply amount of the gas.

7. The EFEM of claim 1, further comprising a substrate transfer robot arranged in the substrate transfer space, wherein the at least one second gas supply part includes an in-transfer robot gas supply device configured to supply gas into the substrate transfer robot, and wherein the control part is configured to:

determine whether the transfer robot gas supply device supplies the gas; and in response to determining that the transfer robot gas supply device supplies the gas, calculate the target supply amount of the gas to be supplied from the first gas supply part into the housing, based on a value obtained by subtracting a supply amount of the gas supplied from the in-transfer robot gas supply device from the total supply amount of the gas.

8. The EFEM of claim 3, further comprising a substrate transfer robot arranged in the substrate transfer space, wherein the at least one second gas supply part further includes an in-transfer robot gas supply device configured to supply gas into the substrate transfer robot, and wherein the control part is configured to:

determine whether the transfer robot gas supply device supplies the gas; and in response to determining that the transfer robot gas supply device supplies the gas, calculate the target supply amount of the gas to be supplied from the first gas supply part into the housing, based on a value obtained by subtracting a supply amount of the gas supplied from the in-transfer robot gas supply device from the total supply amount of the gas.

9. The EFEM of claim 1, wherein the at least one second gas supply part includes an ionizer configured to remove static electricity from a substrate in the substrate transfer space by locally supplying gas to the substrate, and wherein the control part is configured to:

determine whether the ionizer supplies the gas; and in response to determining that the ionizer supplies the gas, calculate the target supply amount of the gas to be supplied from the first gas supply into the housing, based on a value obtained by subtracting a supply amount of the gas supplied from the ionizer from the total supply amount of the gas.

10. The EFEM of claim 3, wherein the at least one second gas supply part further includes an ionizer configured to remove static electricity from a substrate in the substrate transfer space by locally supplying gas to the substrate, and wherein the control part is configured to:

determine whether the ionizer supplies the gas; and in response to determining that the ionizer supplies the gas, calculate the total supply amount of the gas to be supplied from the first gas supply part into the housing, based on a value obtained by subtracting a supply amount of the gas supplied from the ionizer from the total supply amount.

11. A method of controlling gas supplied to an EFEM including a housing having a substrate transfer space in the housing, a first supply part configured to supply gas into the housing via a first supply path, at least one second supply part configured to supply gas into the housing via a second supply path different from the first supply path, and a control part configured to control supplying the gas from the first gas supply, the method comprising:

setting a total supply amount of gas to be supplied into the housing based on an oxygen concentration in the housing;

determining whether the gas is supplied from the at least one second gas supply part into the housing;

in response to determining that the gas is supplied from the at least one second gas supply part into the housing, calculating a target supply amount of the gas to be supplied from the first gas supply part into the housing, based on a value obtained by subtracting a supply amount of the gas supplied from the at least one second gas supply part from the total supply amount of the gas; and controlling the first gas supply part according to a calculation result for the target supply amount of the gas to be supplied from the first gas supply part into the housing.

* * * * *